(12) United States Patent
Offenberg et al.

(10) Patent No.: US 6,187,607 B1
(45) Date of Patent: Feb. 13, 2001

(54) MANUFACTURING METHOD FOR MICROMECHANICAL COMPONENT

(75) Inventors: Michael Offenberg, Kirchentellinsfurt; Udo Bischof, Wannweil; Markus Lutz, Reutlingen, all of (DE)

(73) Assignee: Robert Bosch GmbH, Stuttgart (DE)

( * ) Notice: Under 35 U.S.C. 154(b), the term of this patent shall be extended for 0 days.

(21) Appl. No.: 09/292,282

(22) Filed: Apr. 15, 1999

(30) Foreign Application Priority Data

Apr. 18, 1998 (DE) ................................................ 198 17 311

(51) Int. Cl.$^7$ .................................................. H01L 21/302
(52) U.S. Cl. .................................. 438/48; 438/52; 438/53
(58) Field of Search ............................... 21/2, 48, 50, 52, 21/53; 257/415, 418, 419; 438/690, 723, 719, 739, 738, 488

(56) References Cited

U.S. PATENT DOCUMENTS

| | | | |
|---|---|---|---|
| 5,576,250 | * 11/1996 | Diem et al. ............................... | 438/53 |
| 5,723,353 | * 3/1998 | Muenzel et al. ......................... | 438/50 |
| 5,801,070 | * 9/1998 | Zanini-Fisher et al. ............... | 438/48 |
| 5,814,530 | * 9/1998 | Tsai et al. ................................ | 438/50 |
| 5,828,115 | * 10/1998 | Core ........................................ | 438/50 |
| 5,851,851 | * 12/1998 | Uenoyama et al. .................... | 438/50 |
| 5,872,044 | * 2/1999 | Fujii ........................................ | 438/52 |
| 5,912,494 | * 6/1999 | Diem et al. ............................. | 438/53 |
| 6,022,754 | * 2/2000 | Guillemet et al. ..................... | 438/48 |
| 6,090,638 | * 7/2000 | Uigna et al. ............................ | 438/50 |

FOREIGN PATENT DOCUMENTS 43 17 274   12/1994   (DE) .
195 30 736   8/1996   (DE) .

* cited by examiner

*Primary Examiner*—Savitri Mulpuri
(74) *Attorney, Agent, or Firm*—Kenyon & Keynon

(57) ABSTRACT

A manufacturing method for a micromechanical component, and in particular for a micromechanical rotation rate sensor, which has a supporting first layer, an insulating second layer that is arranged on the first layer, and a conductive third layer that is arranged on the second layer. The method includes the following steps: provide the second layer, in the form of patterned first and second insulation regions, on the first layer; provide a first protective layer on an edge region of the first insulation regions and on a corresponding boundary region of the first layer; provide the third layer on the structure resulting from the previous steps; pattern out a structure of conductor paths running on the first insulation regions, and a functional structure of the micromechanical component above the second insulation regions, from the third layer; and remove the second layer in the second insulation regions, the second layer being protected in the first insulation regions by the first protective layer in such a way that it is essentially not removed there.

13 Claims, 4 Drawing Sheets

MANUFACTURING METHOD FOR MICROMECHANICAL COMPONENT

FIELD OF THE INVENTION

The present invention relates to a method for manufacturing a micromechanical component, and in particular a micromechanical rotation rate sensor, which has a supporting first layer, an insulating second layer that is arranged on the first layer, and a conductive third layer that is arranged on the second layer.

BACKGROUND INFORMATION

Although applicable in principle to any micromechanical components, the present invention and the problem underlying it are explained with reference to a micromechanical rotation rate sensor using the manufacturing technology of surface micromechanics, as described in German Patent Application No. 195 30 736.

FIG. 6 shows a conventional micromechanical rotation rate sensor. FIGS. 7–13 show conventional steps for manufacturing the micromechanical rotation rate sensor shown in FIG. 6.

This rotation rate sensor is constructed from a three-layer system, usually from an SOI (silicon-on-insulator) system, in particular a silicon-insulator-silicon system.

It has a first layer 1 made of lightly doped silicon, a second layer 2 overlying it made of silicon dioxide, and a third layer 3 overlying that made of heavily doped silicon, which can also be polycrystalline.

FIG. 6 shows a frame 8 in which a vibratory mass 5 is arranged via lands 9 in a manner allowing vibration. Vibratory mass 5 is excited via drive means 21 (Lorentz forces) to vibrate linearly in the arrow direction. A conventional acceleration sensor 6 having a usual comb structure is arranged on vibratory mass 5. Acceleration sensor 6 is applied in the detection direction, perpendicular to the vibration direction of vibratory mass 5.

FIG. 6 further shows conductor paths 4 which proceed from retaining beams 18, 19 and the deflectable mass 7 of acceleration sensor 6 and pass via lands 9 to frame 8. Conductor paths 4 are patterned out of third layer 3, and in frame 8 are electrically insulated by recesses 10 from third layer 3 of frame 8.

Lands 9 are patterned both out of the upper third layer 3 and out the lower first layer 1. Conductor paths 4 arranged on frame 8 transition directly into lands 9, so that direct electrical contacting of the acceleration sensor is achieved through them.

On vibratory mass 5, recesses 10 are also provided in the outlet opening region of lands 9 as insulating trenches in upper layer 3, so that here again electrical insulation is guaranteed for the signals which pass via the lands from and to vibratory mass 5. Conductor paths 4 end in connector pads 20 from which the signals are transmitted to an electronic analysis system.

The manufacturing process of the rotation rate sensor shown in FIG. 6 will be explained below in more detail with reference to FIGS. 7–13.

On third layer 3, preferably aluminum metal strips 24 are formed in the regions of conductor paths 4 by vacuum evaporation or sputtering and subsequent patterning. A first cover layer 11 made of silicon dioxide and a second cover layer 12 made of plasma nitride are applied on the back side of first layer 1, and a third cover layer 14 made of silicon dioxide is applied on the front side of third layer 3 equipped with aluminum metal strips 24.

Third cover layer 14 is then patterned in accordance with comb structure 13 of the acceleration sensor and the shape of conductor paths 4 and lands 9. A fourth cover layer 16 in the form of a photoresist is applied onto the patterned third cover layer 14. This fourth cover layer 16 is removed in the region of lands 9. The etching mask here is the oxide; the resist protects only the acceleration sensor.

After corresponding patterning of first and second cover layers 11, 12, first layer 1 inside frame 8 is then etched away to a predefined thickness of typically 100 $\mu$m, and covered with a passivation layer.

In an etching process, trenches for which the patterned third cover layer 14 and fourth cover layer 16 serve as etching mask are then introduced on the front side. These trenches are etched in until second and third layers 2, 3 have been completely penetrated and a portion of first layer 1 has been removed, specifically until the remaining thickness corresponds approximately to the thickness of layer 3. Fourth cover layer 16 is then removed, and the etching process is continued until first layer 1 has also been completely penetrated. The patterned third cover layer 14 now acts as an etching mask in the acceleration sensor region, which contains the patterns for lands 9, comb structures 13, and conductor paths 4. The etching process is configured so that only first and third layers 1, 3, but not second layer 2 and passivation layer 17, are etched, preferably anisotropically in $SF_6$ plasma.

Altogether, etching is continued until the trenches for lands 9 reach passivation layer 17, and the trenches for comb structures 13 and conductor paths 4 reach second layer 2.

Second layer 2 is then etched out beneath comb structures 13, and simultaneously lands 9 are etched out of second layer 2, the etching medium preferably used for this purpose is HF gas, as described in German Patent No. 43 17 274.

Passivation layer 17 is also etched away, in order to produce the rotation layer shown in FIG. 6.

The problem on which the present invention is based is in general the fact that the underetching labeled U in FIG. 13 is desired and necessary for the function of acceleration sensor 6 in the region of comb structures 13 with their typically 11-$\mu$m thick and 5-$\mu$m wide polycrystalline silicon, but is extremely troublesome in the region of the supply leads, i.e. of lands 9 with conductor paths 4.

In the finished product these supply leads, which have a mechanical spring function especially in the region between frame 8 and vibratory mass 5, are typically made up of a layer sequence of 65-$\mu$m thick monocrystalline silicon as first layer 1, 2.2-$\mu$m thick silicon dioxide as second layer 2, 1-$\mu$m thick polycrystalline silicon as third layer 3, and an aluminum layer 1.3 $\mu$m thick.

Because of the exposed location of comb structures 13, the HF gas attacks second layer 2 particularly vigorously in the region of the supply leads. If the second layer is excessively underetched or even removed in this region, the resulting component is unusable, since the mechanical connection and electrical insulation between first and third layers 1, 3 is lost. This phenomenon leads to poor yields for the existing manufacturing process explained above.

One usual approach to limiting underetching is to adjust the geometry of the rotation rate sensor such that the silicon dioxide of second layer 2 that is to be etched requires only 2.5 $\mu$m of underetching, the supply lead oxide being 21 $\mu$m wide. This allowance is more than compensated for, however, by the preferential etching of the supply lead oxide, so that poor yields still occur.

Another possible approach would be to replace the supply lead oxide with a slower-etching second layer 2, but it has been found that the dielectric layers commonly used in semiconductor technology, such as nitride, etc., have too little resistance to the HF gas.

It is therefore desirable to protect the supply lead oxide more effectively in a relatively simple process.

SUMMARY OF THE INVENTION

The manufacturing method according to the present invention has the advantage that the yield when manufacturing the pertinent micromechanical component, in particular the rotation rate sensor, can be increased by introduction of the stop layer for etching the second layer (sacrificial oxide layer). Underetching no longer occurs, and both mechanical stability and electrical insulation are greatly improved.

The object of the present invention may be achieved by the fact that removal of the second layer can take place in the second insulation regions, while at the same time the second layer in the first insulation regions is protected by the first protective layer in such a way that it is essentially not removed there.

In other words, the second layer serves in the second insulation regions as a sacrificial layer (complete underetching desired), and in the first insulation regions it is essentially protected by the first protective layer (no underetching desired).

At the same time, it is possible with the proposed procedure to prevent underetching of bonding pads in the connecting region, which represents a risk in terms of shunts.

According to a preferred embodiment, formation of the first protective layer is accomplished by deposition and patterning of two additional layers, namely deposition and patterning of a thin LPCVD polysilicon layer with a thickness in the range from 10 to 50 nm, preferably 30 nm; and deposition and patterning of an insulating fourth layer, preferably a silicon dioxide layer, on the thin LPCVD polysilicon layer.

According to a further preferred embodiment, patterning of the conductor path structure and the functional structure is accomplished by deposition and patterning of a metallization layer, which preferably includes aluminum, on the third layer in order to form the conductor paths; and by provision of a second protective layer, on the conductor paths, which preferably is also a silicon dioxide layer.

According to another preferred embodiment, etching of the third and the first layer is accomplished using the second and the first protective layer as masks. In other words, the third layer is first etched with the second protective layer as mask, and then the first layer with the first protective layer as mask, in the same etching process.

According to yet another preferred embodiment, the first layer is etched through beneath certain regions of the conductor paths to form resilient lands with corresponding conductor paths. Good mechanical joining of the conductor paths to the insulation material underlying them is important precisely in such resilient lands, since otherwise breakage of the structure can easily occur upon deflection.

According to a further preferred embodiment, a removal of the first protective layer is performed in the first insulation regions. This is important particularly when the first protective layer is intended not to cause any troublesome electrical shunting to the first layer.

According to another preferred embodiment, a removal of the insulating fourth layer of the first protective layer is accomplished in the first insulation regions, and a removal of the second protective layer, in the same process step as the removal of the second layer, in the second insulation regions. This can be accomplished by way of a simple etching process if, for example, all the layers are made of silicon dioxide, thus eliminating a further process step.

According to yet another preferred embodiment, a removal of the thin LPCVD polysilicon layer of the first protective layer takes place via a preferably fluorine-containing plasma or by sputtering with argon ions. It is important in this context to prevent charging of the etched-out functional structures, since they might otherwise deflect and irreversibly adhere to one another.

DETAILED DESCRIPTION

FIGS. 1–5 show an exemplary embodiment of a method according to the present invention for manufacturing a micromechanical rotation rate sensor.

FIGS. 1–5 show a thin LPCVD (low-pressure chemical vapor deposition) polysilicon layer 100, and a thermal silicon dioxide layer 150. The layers 100, 150 together may be referred to as the first protective layer. Furthermore, FIGS. 1–5 show a second protective layer 140 made of thermal silicon dioxide.

Figure 13:
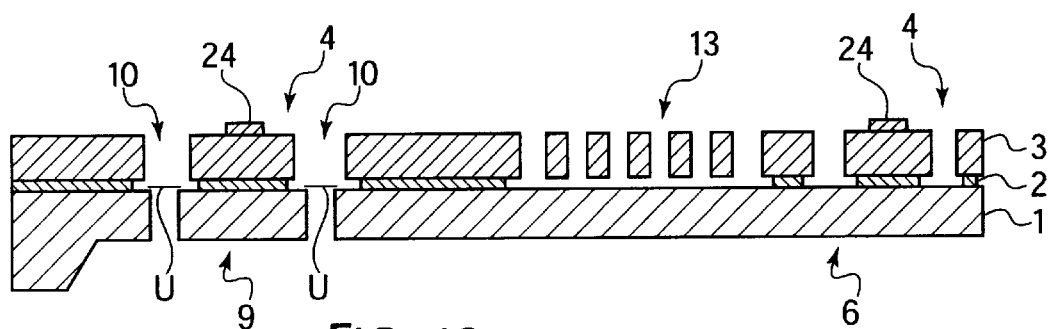
FIG. 13 shows a seventh step of the conventional method.

FIGS. 1–5 show the process sequence according to this embodiment for cutting out land 9 in FIG. 13; the remainder of the patterning proceeds identically.

The manufacturing method according to this embodiment thus also concerns a micromechanical rotation rate sensor. The rotation rate sensor has in general a supporting first layer 1 made of lightly doped silicon, an insulating second layer 2 made of silicon dioxide that is arranged on first layer 1, and a conductive third layer 3 made of heavily doped epitactically deposited polysilicon, which is arranged on second layer 2.

After the deposition of second layer 2 made of silicon dioxide, the latter is patterned in first and second insulation regions on first layer 1 using a usual photolithographic etching method. The region of second layer 2 shown in FIGS. 1–5 is a first insulation region in which a structure of conductor paths 4 running thereabove is to be formed. The second insulation regions are located in the remaining region, for example below in the region of the later comb structure 13, which is not depicted in FIGS. 1–5 for reasons of clarity.

Figure 1:
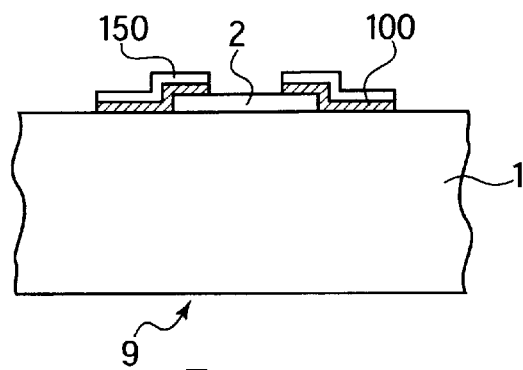
FIG. 1 shows a first step of an exemplary embodiment of a method according to the present invention for manufacturing a micromechanical rotation rate sensor.
Figure 2:
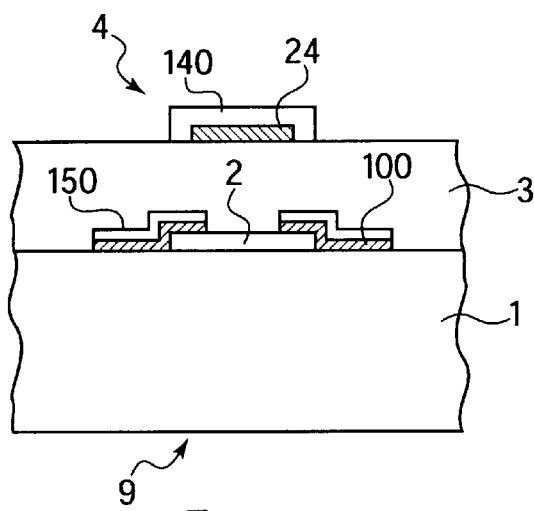
FIG. 2 shows a second step of the method according to the present invention.

First protective layer 100, 150 is then provided on an edge region of the first insulation regions and on a corresponding boundary region of first layer 1, as illustrated in FIG. 1. This is accomplished by deposition and patterning of the thin LPCVD polysilicon layer 100 at a thickness of 30 nm, and deposition and patterning of an insulating fourth layer 150 in the form of a silicon dioxide layer deposited on the thin LPCVD polysilicon layer 100. In the example shown, the two layers, once patterned, lie congruently on one another.

Third layer 3 made of polysilicon is then epitactically deposited on the resulting structure.

Next there occurs a deposition and patterning of a metallization layer 24, made of aluminum, on third layer 3 to form conductor paths 4, and deposition of second protective layer 140, as a silicon dioxide layer, on conductor paths 4.

This silicon dioxide layer corresponds to the conventional silicon dioxide layer 14 as shown in FIGS. 7–13, and it too serves to mask comb structure 13 and other functional regions of the rotation rate sensor.

Figure 3:
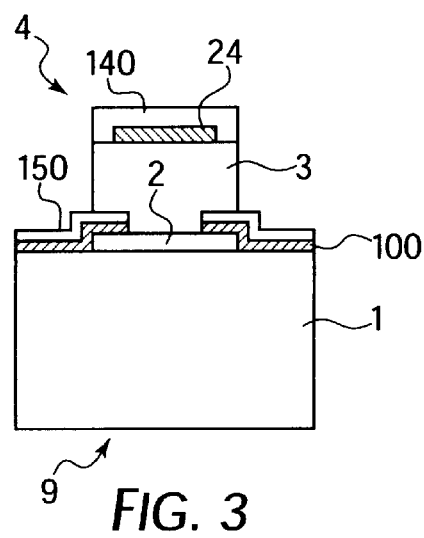
FIG. 3 shows a third step of the method according to the present invention.
Figure 4:
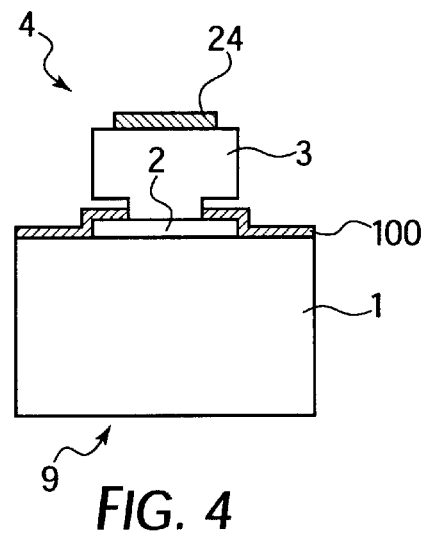
FIG. 4 shows a fourth step of the method according to the present invention.
Figure 11:
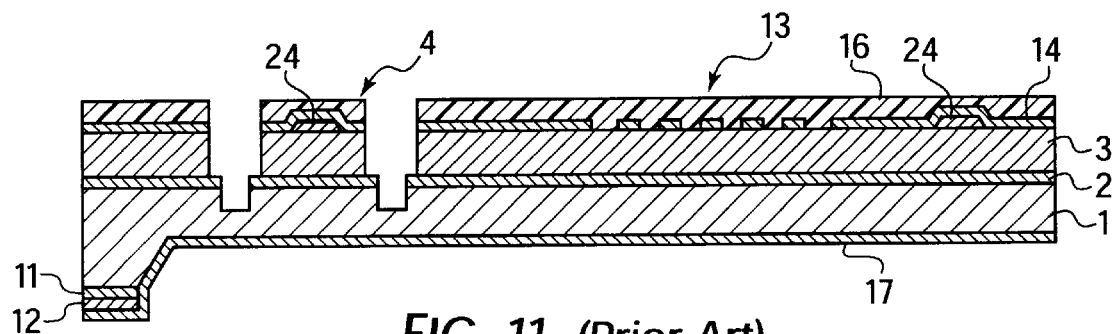
FIG. 11 shows a fifth step of the conventional method.
Figure 12:
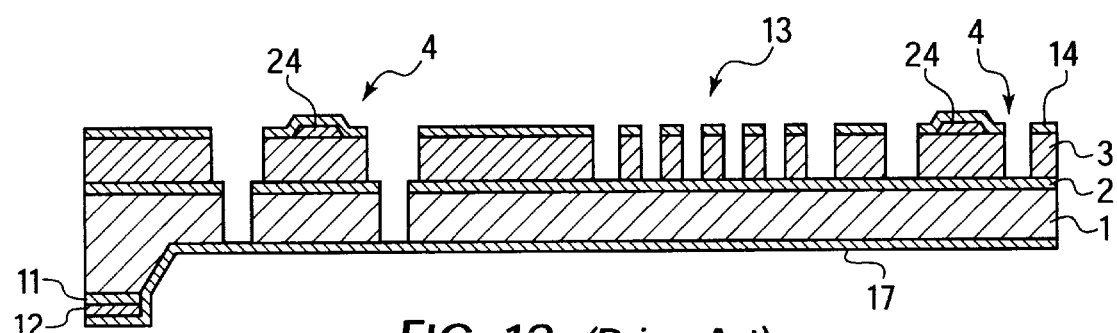
FIG. 12 shows a sixth step of the conventional method.

A subsequent etching process is then accomplished, patterning out a structure of conductor paths 4 running on the first insulation regions (as illustrated in FIG. 3) and a functional structure of the micromechanical component over the second insulation regions (as shown in FIGS. 11 and 12), using second protective layer 140 and first protective layer 100, 150 as masks. In this context, first layer 1 is etched through to form the resilient land 9.

Second layer 2 is then removed in the second insulation regions, second layer 2 being protected, in the first insulation regions, by first protective layer 100, 150 in such a way that it is essentially not removed there. In the present invention, silicon dioxide layers 140 and 150 are simultaneously removed in this sacrificial layer etching.

The thin LPCVD polysilicon layer 100 of first protective layer 100, 150 is then removed with a fluorine-containing plasma or by sputtering with argon ions. In order to prevent charging of the etched-out functional structures, which might deflect and irreversibly adhere to one another if such charging occurred, the layer thickness selected was very thin (30 nm), so that the corresponding process time is very short.

Figure 5:
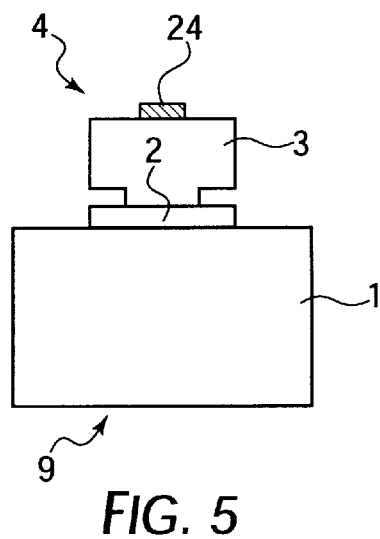
FIG. 5 shows a fifth step of the method according to the present invention.
Figure 6:
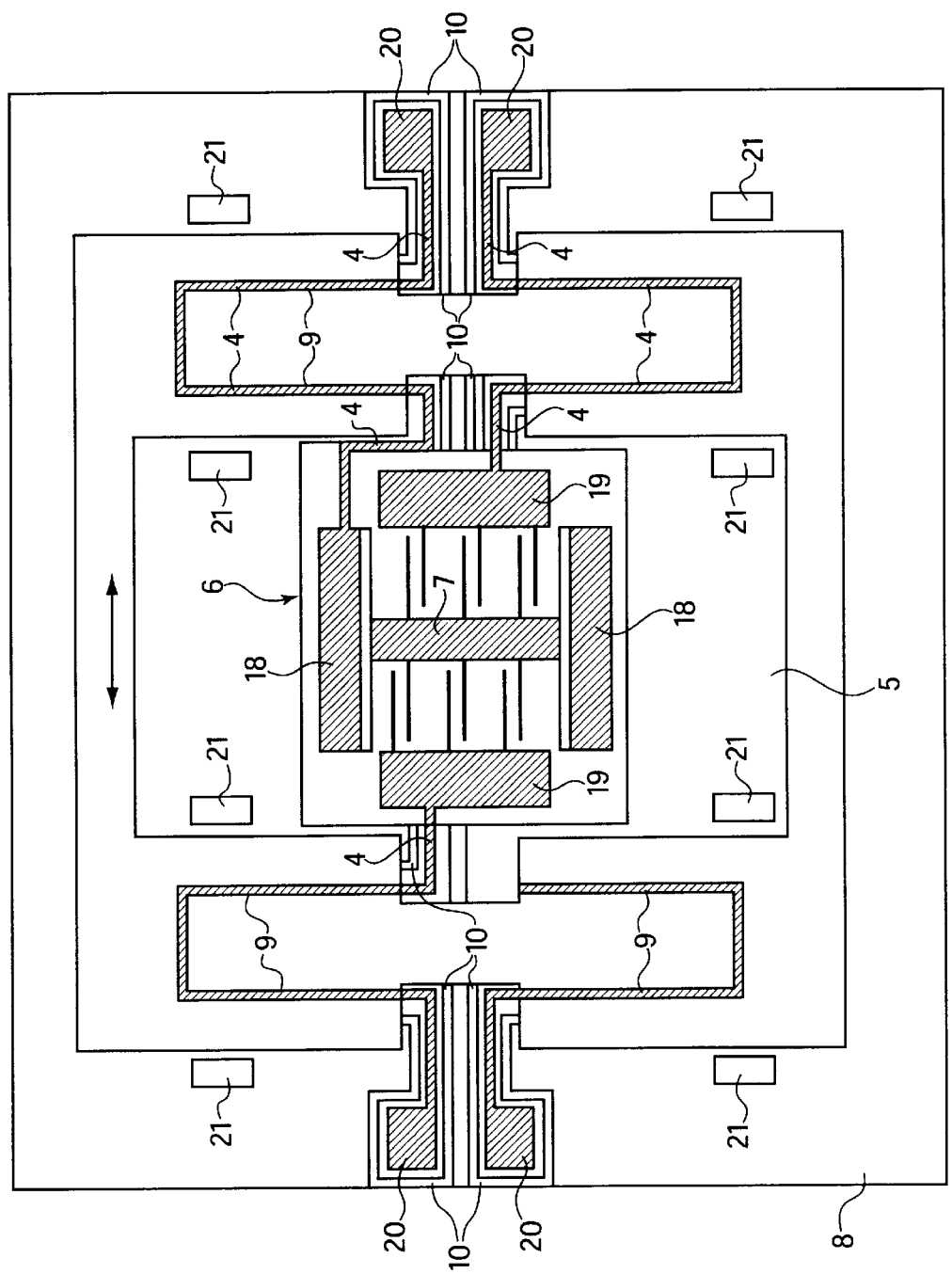
FIG. 6 shows a schematic depiction of a conventional micromechanical rotation rate sensor.
Figure 7:
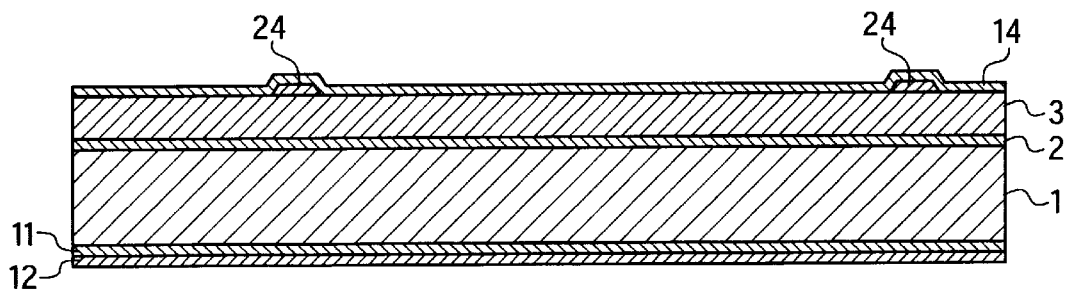
FIG. 7 shows a first step of a conventional method for manufacturing the conventional micromechanical rotation rate sensor as depicted in FIG. 6.
Figure 8:
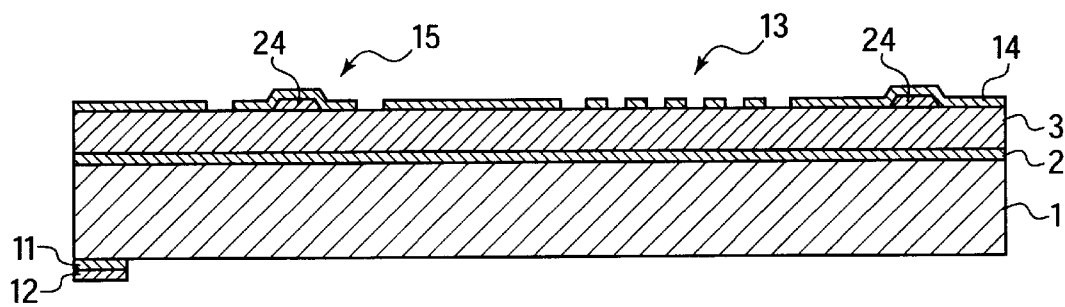
FIG. 8 shows a second step of the conventional method.
Figure 9:
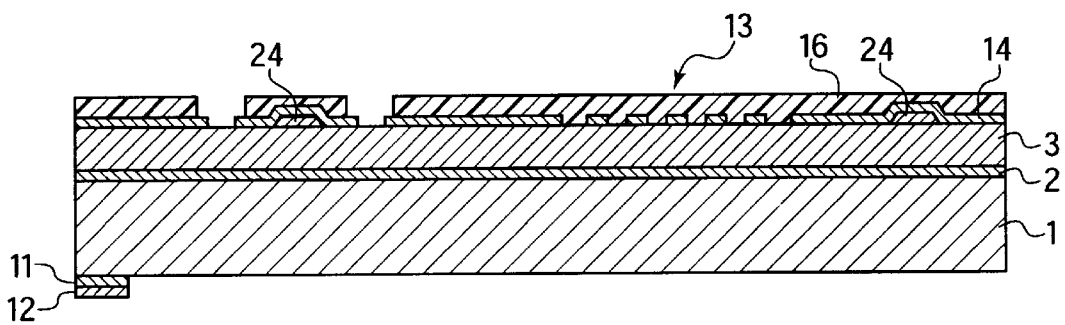
FIG. 9 shows a third step of the conventional method.
Figure 10:
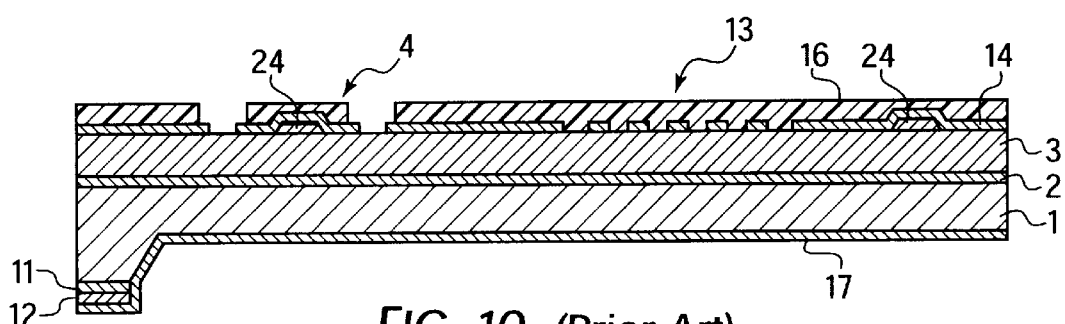
FIG. 10 shows a fourth step of the conventional method.

The final result is the structure shown in FIG. 5, in which, in contrast to the aforementioned existing art, supply lead oxide 2 is no longer etched or underetched. For process-related reasons, third layer 3 has a 2-μm deep undercut which is nevertheless easily controllable and therefore causes no problems.

Although the present invention has been described above with reference to a preferred exemplary embodiment, it is not limited thereto but rather can be modified in many ways.

In particular, the manufacturing method according to the present invention can be applied not only to micromechanical rotation rate sensors, but rather to any micromechanical components in which, in a single layer, underetching with respect to an overlying layer is required in certain regions and not in others.

The present invention is also usable not only for silicon components, but also for components made of other micromechanical materials.

In particular, process sequences other than those set forth are conceivable in order to implement the basic idea, i.e. local sealing of the sacrificial layer. For example, the thin LPCVD polysilicon layer can be deposited at an earlier time in the process in order to eliminate the need to remove an overlying silicon dioxide layer. The silicon dioxide layer must then, however, be etched a second time.

List of Reference Characters

U Underetching
1 First layer
2 Second layer
3 Third layer
4 Conductor path
5 Vibratory mass
6 Acceleration sensor
7 Deflectable mass
8 Frame
9 Land
10 Recess
11 First cover layer
12 Second cover layer
13 Comb structures
14 Third cover layer
16 Fourth cover layer
17 Passivation layer
18, 19 Retaining beams
20 Connector pads
21 Drive means
24 Aluminum metal strips
100 LPCVD polysilicon layer
140 Silicon dioxide layer
150 Silicon dioxide layer

What is claimed is:

1. A method for manufacturing a micromechanical component, the component including a first supporting layer, a second insulating layer and a third conductive layer, the method comprising the steps of:

a) providing the second insulating layer on the first supporting layer, the second insulating layer having first patterned insulation regions and second patterned insulation regions;

b) providing a first protective layer on an edge region of the first insulation regions and on a corresponding boundary region of the first supporting layer to form a resulting structure;

c) providing the third conductive layer on the resulting structure;

d) patterning a further structure of conductor paths and a functional structure of the component from the third conductive layer, the conductor paths extending on the first insulation regions, the functional structure being above the second insulation regions; and e) removing the second insulating layer in the second insulation regions, wherein, in the first insulation regions, the second insulating layer is protected by the first protective layer without being substantially removed from the second insulation regions.

2. The method according to claim 1, wherein the component includes a micromechanical rotation rate sensor.

3. The method according to claim 1, wherein step (b) includes the substeps of:

depositing and patterning a thin LPCVD polysilicon layer having a thickness in a range from 10 nm to 50 nm, and depositing and patterning a fourth insulating layer on the thin LPCVD polysilicon layer.

4. The method according to claim 3, wherein the thickness is 30 nm.

5. The method according to claim 1, wherein step (d) includes the substeps of:
   depositing and patterning a metallization layer on the third conductive layer to form the conductor paths, and
   providing a second protective layer on the conductor paths.

6. The method according to claim 5, wherein the metallization layer is composed of aluminum.

7. The method according to claim 5, wherein step (d) further includes the substep of:
   etching the third conductive layer and the first supporting layer using the second and first protective layers as masks.

8. The method according to claim 7, wherein step (d) further includes the substep of:
   etching through the first supporting layer beneath specific regions of the conductor paths to form resilient lands with corresponding conductor paths.

9. The method according to claim 1, further comprising the step of:
   f) removing the first protective layer in the first insulation regions.

10. The method according to claim 3, further comprising the step of:
    g) removing the fourth insulating layer of the first protective layer in the first insulation regions, and
    wherein step (e) includes the substep of:
       removing the second protective layer in the second insulation regions.

11. The method according to claim 10, further comprising the step of:
    h) removing the thin LPCVD polysilicon layer of the first protective layer.

12. The method according to claim 11, wherein step (h) is performed using a fluorine-containing plasma.

13. The method according to claim 11, wherein step (h) is performed by sputtering the thin LPCVD polysilicon layer with argon ions.

* * * * *